US010938407B2

(12) United States Patent
Albinet

(10) Patent No.: US 10,938,407 B2
(45) Date of Patent: Mar. 2, 2021

(54) SIGMA-DELTA ANALOG TO DIGITAL CONVERTER

(71) Applicant: NXP B.V., Eindhoven (NL)

(72) Inventor: Xavier Albinet, Roquefort les Pins (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/798,385

(22) Filed: Feb. 23, 2020

(65) Prior Publication Data

US 2020/0287563 A1 Sep. 10, 2020

(30) Foreign Application Priority Data

Mar. 5, 2019 (EP) .................................... 19305255

(51) Int. Cl.
| | |
|---|---|
| *H03M 3/00* | (2006.01) |
| *G10L 25/78* | (2013.01) |
| *H03M 1/00* | (2006.01) |
| *H03M 1/12* | (2006.01) |
| *H03G 5/02* | (2006.01) |
| *H03G 3/34* | (2006.01) |

(52) U.S. Cl.
CPC ............. *H03M 3/392* (2013.01); *G10L 25/78* (2013.01); *H03M 3/30* (2013.01); *H03M 3/462* (2013.01); *H03G 3/348* (2013.01); *H03G 5/025* (2013.01); *H03M 1/00* (2013.01); *H03M 1/12* (2013.01)

(58) Field of Classification Search
CPC ............ H03M 3/30; H03M 1/12; H03M 1/00; H03G 5/025; H03G 3/348
USPC ........ 341/143, 155, 126, 158; 381/104, 94.5
See application file for complete search history.

(56) References Cited

U.S. PATENT DOCUMENTS

| | | | | |
|---|---|---|---|---|
| 6,087,969 | A | * | 7/2000 | Stockstad ............. H03M 3/394 341/143 |
| 6,577,258 | B2 | | 6/2003 | Ruha et al. |
| 7,116,259 | B2 | | 10/2006 | Garlapati et al. |
| 7,379,002 | B1 | | 5/2008 | Zhixu et al. |
| 8,264,392 | B1 | * | 9/2012 | Zarei ...................... H03M 3/47 341/156 |
| 8,405,535 | B1 | | 3/2013 | Xiao et al. |
| 8,421,660 | B1 | | 4/2013 | Wan et al. |
| 9,509,332 | B1 | | 11/2016 | Garrity et al. |

(Continued)

FOREIGN PATENT DOCUMENTS

GB 2553472 A 3/2018

OTHER PUBLICATIONS

Markus, J. et al; "Theory and Applications of Incremental Delta Sigma Converters"; IEEE Transactions on Circuits and Systems Part 1: Regular Papers, IEEE Service Center, NY, NY, US, vol. 51, No. 4; 13 pages (Apr. 13, 2004).

*Primary Examiner* — Joseph J Lauture

(57) ABSTRACT

A sigma-delta analog-to-digital converter (ADC) is disclosed. The sigma delta ADC has an analog input and a digital output. A sigma-delta modulator input is coupled to the analog input and a sigma-delta modulator output. A first filter having a first filter input is coupled to the sigma-delta modulator output and a first filter output. A second filter having a second filter input is coupled to the sigma-delta modulator output and a second filter output. The sigma-delta ADC operates in a first and second mode. In a first mode, the first filter output is coupled to the digital output. In a second mode, the second filter output is coupled to the digital output.

22 Claims, 2 Drawing Sheets

(56) References Cited

U.S. PATENT DOCUMENTS

| | | | |
|---|---|---|---|
| 2006/0013413 A1* | 1/2006 | Sakaidani | H03G 3/348 |
| | | | 381/104 |
| 2009/0003629 A1* | 1/2009 | Shajaan | H04R 19/04 |
| | | | 381/113 |
| 2018/0048345 A1* | 2/2018 | Pehlke | H04B 1/40 |

* cited by examiner

SIGMA-DELTA ANALOG TO DIGITAL CONVERTER

CROSS-REFERENCE TO RELATED APPLICATIONS

This application claims the priority under 35 U.S.C. § 119 of European patent application no. 19305255.2, filed Mar. 5, 2019 the contents of which are incorporated by reference herein.

FIELD

This disclosure relates to sigma-delta analog to digital converters.

BACKGROUND

Sigma-delta (ΣΔ) analog to digital converters, also referred to as delta-sigma (ΔΣ) analog to digital converters are widely used in audio applications such as smart amplifier, digital and analog microphones, power integrated circuits and instrumentation. In some audio systems, the system may have an initial low power or standby mode and then change to the normal operation mode when sound is detected.

SUMMARY

Various aspects of the disclosure are defined in the accompanying claims. In a first aspect there is provided a sigma-delta analog-to-digital converter (ADC) comprising an analog input; a digital output; a sigma-delta modulator having a sigma-delta modulator input and a sigma-delta modulator output, wherein the sigma-delta modulator input is coupled to the analog input; a first filter having a first filter input and a first filter output, wherein the first filter input is coupled to the sigma-delta modulator output; a second filter having a second filter input and a second filter output, wherein the second filter input is coupled to the sigma-delta modulator output; wherein the ADC is configured to operate in a first mode and a second mode, wherein in the first mode the first filter output is coupled to the digital output and wherein in the second mode the second filter output is coupled to the digital output.

In one or more embodiments, the second filter may have a higher accuracy than the first filter.

In one or more embodiments, the ADC power consumption may be higher in the second mode than the first mode.

In one or more embodiments, in the first mode, the ADC may be configured to operate in a burst mode.

In one or more embodiments, in the second mode, the ADC may be configured to be continuously enabled.

In one or more embodiments, the first filter and second filter may be configured as decimators.

In one or more embodiments, the first filter may comprise a counter and wherein in the first mode, the counter is configured to count the number of bits received within a predetermined time period and to output a value of the number of bits received to the first filter output.

In one or more embodiments, the sigma-delta ADC may comprise a timer coupled to the sigma-delta modulator and the counter, wherein the timer is configured in the first mode to generate a reset signal after a predetermined time; and wherein the counter is configured in response to receiving the reset signal to output the current count value to the digital output and to reset the count to zero and the sigma-delta modulator is configured to reset in response to receiving the reset signal.

In one or more embodiments, the sigma-delta ADC may comprise a register coupled to the timer, wherein in the first mode, the timer is further configured to generate a reset signal after a time interval determined from a value in the register.

In one or more embodiments, the sigma-delta ADC may comprise a multiplexer having a first multiplexer input coupled to the first filter output, a second multiplexer input coupled to the second filter output, a control input coupled to a mode control input; and a multiplexer output coupled to the digital output.

In one or more embodiments, the mode control input may be coupled to the timer.

In one or more embodiments, the sigma-delta modulator may comprise an integrator configured in the first mode to be reset after a predetermined time interval.

In one or more embodiments, the integrator may comprise a capacitor in the feedback path and configured to be reset by shorting the capacitor.

In one or more embodiments, the sigma-delta modulator may comprise a series arrangement of a summing module, the integrator and a comparator between the sigma-delta modulator input and the sigma-delta modulator output; and a digital to analog converter, DAC, having an input coupled to the sigma-delta modulator output and an output coupled to an inverting input of the summing module, and wherein the sigma-delta modulator input is coupled to a non-inverting input of the summing module.

Embodiments of the sigma-delta ADC may be included in a voice activity detector wherein the sigma-delta ADC is configured to change from the first mode to the second mode in response to the detection of audio. The voice activity detector may comprise a voice activation module having an input coupled to the digital output and an output configured to generate a mode control signal wherein the sigma-delta ADC is configured to receive the mode control signal and to set the operation mode to either the first mode or the second mode dependent on the mode control signal.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION OF EMBODIMENTS

Figure 1:
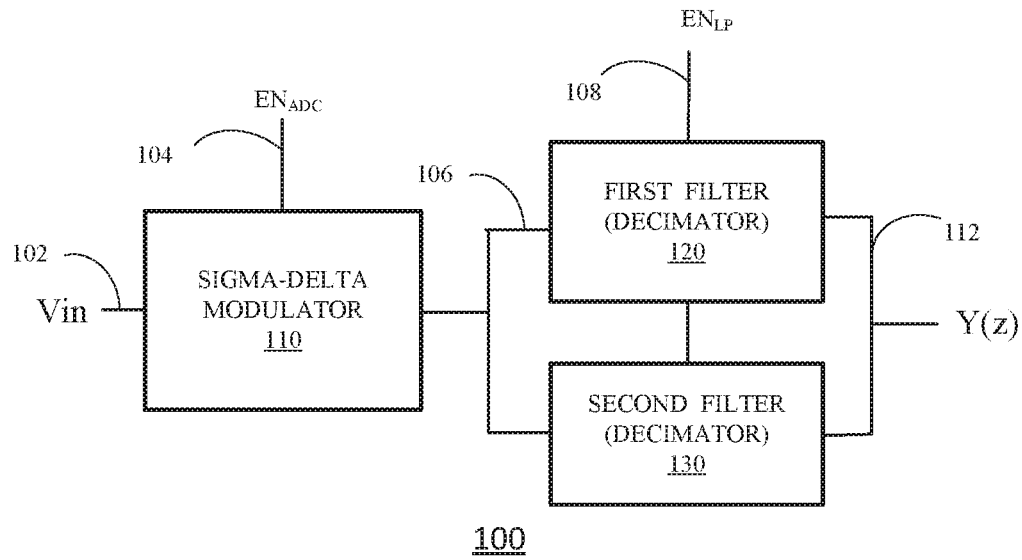
FIG. 1 Shows a sigma-delta analog to digital converter according to an embodiment.

FIG. 1 shows a sigma-delta analog to digital converter (ADC) 100. The sigma-delta ADC 100 includes a sigma-delta modulator 110 a first filter 120 and a second filter 130. The sigma-delta modulator 110 may also be referred to as a delta sigma modulator. The first filter 120 and second filter 130 may be a decimator filter or low pass filter. The sigma-delta ADC 100 may have an analog input 102 connected to an input of the sigma-delta modulator 110. The sigma-delta modulator output 106 may be connected to the first filter 120. An output of the first filter 120 may be connected to the digital output 112 of the sigma-delta ADC 100. The sigma-delta modulator output 106 may be connected to the second filter 130. An output of the second filter 130 may be connected to the digital output 112 of the sigma-delta ADC 100. A mode enable input ($EN_{LP}$) 108 may be connected to an enable input of the first filter 120. A mode enable input 108 may be connected to an enable input of the second filter 130. An ADC enable input 104 may be connected to the sigma-delta modulator 110.

The sigma-delta modulator 110 typically operates by receiving an analog input signal which is than oversampled at a sampling frequency typically much larger that the Nyquist sample frequency. The sigma-delta modulator 110 outputs a digital bit-stream which is typically a pulse density modulated bitstream on the sigma delta modulator output 106.

The first filter 120 and the second filter 130 may perform a similar function of down-sampling the oversampled bitstream output from the sigma-delta modulator 110 and removing at least some of the quantization noise generated by the sigma-delta modulator as an artefact of the analog to digital conversion. Because the input signal is oversampled by the sigma-delta modulator 110, the noise is noise-shaped such that most of the quantization noise occurs at a frequency higher than the signal frequency and can be removed by low pass filtering. The combination of low pass filtering and down sampling the digital bitstream may be referred to as decimation filtering.

In a first mode of operation which may be considered a low power mode, the sigma delta ADC 100 power consumption may be reduced for example by operating the sigma-delta modulator 110 in a burst mode. In a burst mode an enable signal is applied to the sigma-delta modulator enable input 104 such that the sigma-delta modulator 110 is active for a relatively short time period and inactive for a relatively long time period. In this first mode of operation, the first filter 120 may be enabled by a control signal on the mode enable input 108 and the second filter 120 may be disabled by the control signal on the mode enable input 108. It will be appreciated that the enable signal for the sigma-delta modulator 110 may be generated differently dependent on the state of the mode control input by control logic (not shown).

In the first mode of operation, the sigma-delta ADC 100 may operate in an incremental mode whereby the analog-to-digital conversion is performed with a relatively limited number of analog samples. The number of samples per conversion may be determined by the sigma-delta modulator 100 architecture and the architecture of the first filter 120. The first filter 120 may be implemented to be relatively simple compared to the second filter 130. For example, the first filter may implement a first order low pass filter whereas the second filter may implement a higher order low pass filter.

In a second mode of operation which may be considered a normal mode, the sigma-delta modulator 110 may be continuously enabled by applying an enable signal to the ADC enable input 104 such that the sigma-delta modulator 110 is continuously active. In this second mode of operation, the first filter 120 may be disabled by a control signal on the mode enable input 108 and the second filter 120 may be enabled by the control signal on the mode enable input 108. The second mode of operation typically has a higher power consumption than the first mode and may operate at higher resolution and have an improved signal to noise ratio.

Because in the second mode, the sigma-delta modulator 110 is continuously active, the sigma delta ADC 100 may have a higher bandwidth in the second operation mode than the first operation mode.

The inventor of the present disclosure has appreciated that analog to digital converters used in many systems, for example audio or other sensing devices such as Internet of Things (IoT) devices, may be required to be always-on in a relatively low power mode and then change to a higher power mode in response to an external stimulus. By having a different filter for the first low power mode than the second higher power mode, a single analog front end (AFE) including the sigma-delta modulator may be used to implement a sigma-delta ADC which is configurable either in a low-power or high-power mode. The sigma-delta ADC 100 may require a smaller area compared to known solutions while still achieving required performance in both low power and normal operation modes.

Figure 2:
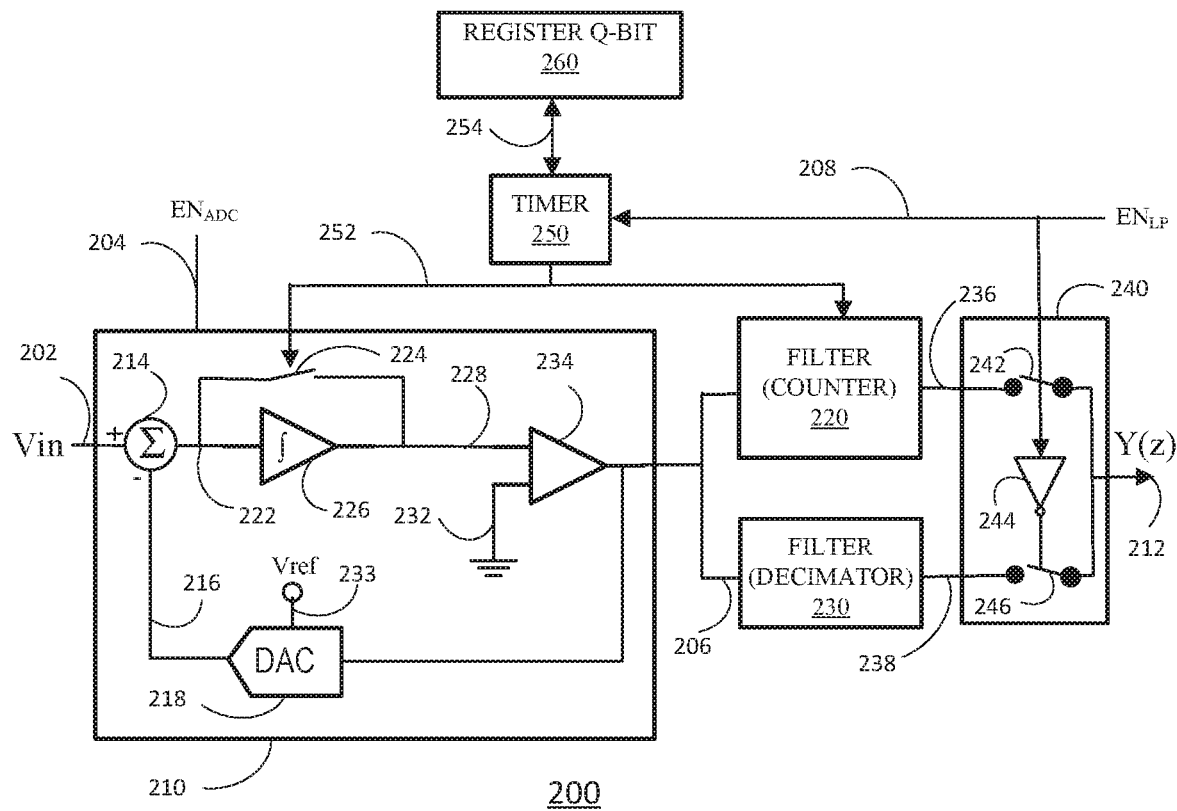
FIG. 2 Illustrates a sigma-delta analog to digital converter according to an embodiment.

FIG. 2 shows a sigma-delta analog to digital converter (ADC) 200. The sigma-delta ADC 200 includes a sigma-delta modulator 210 a first filter 220 and a second filter 230, a multiplexer 240, a timer 250, and a programmable register 260. The sigma-delta modulator 210 may also be referred to as a delta-sigma modulator. The first filter 220 includes a counter and the second filter 220 may be a conventional decimator filter. The sigma-delta ADC 200 may have an analog input 202 connected to an input of the sigma-delta modulator 210. The sigma-delta modulator output 206 may be connected to the first filter 220. An output of the first filter 220 may be connected to a first input 236 of a multiplexer 240. The sigma-delta modulator output 206 may be connected to the second filter 230. An output of the second filter 230 may be connected to a second input 238 of a multiplexer 240. A mode enable input 208 ($EN_{LP}$) may be connected to a select input of the multiplexer 240. The output of multiplexer 240 may be connected to the digital output 212.

An example implementation of the multiplexer 240 is shown in FIG. 2. It will be appreciated that other implementations of a multiplexer may be used. A first switch 242 which may be implemented as a MOS transistor is connected between the first multiplexer input 236 and the multiplexer output. The control input of the first switch 242 is connected to the mode enable input 208. A second switch 246 which may be implemented as a MOS transistor is connected between the second multiplexer input 238 and the multiplexer output. The mode enable input 208 is connected to the control input of the second switch 242 via inverter 244.

The sigma-delta modulator 210 includes a differentiator 214 and integrator 226, a quantizer 234 and a digital to analog converter 218. The differentiator 214 may have a first input which may be a non-inverting input connected to the analog input 202. The differentiator 214 may have a second input which may be an inverting input connected to an output 216 of the digital to analog converter (DAC) 218. An output 222 of the differentiator 214 may be connected to an input of the integrator 226. The integrator output 228 may be connected to an input of the quantizer 234 which may be a comparator for a 1-bit or N comparators arranged in parallel for an N-bit quantizer. An integrator switch 224 may be connected between the differentiator output 222 and the integrator output 228. The second input of the quantizer 234 may be connected to a ground 232. The output of the quantizer 234 may be connected to the sigma-delta modulator output 206. The output of the quantizer 234 may be connected to the input of the DAC 218. The DAC 218 may have a reference voltage input 233.

An ADC enable input 204 may be connected to the sigma-delta modulator 210. The ADC enable input may be connected to one or more of the differentiator 214, the integrator 226, the quantizer 234 and the DAC 218 to enable or disable the sigma-delta modulator 210 and hence enable or disable the sigma-delta ADC 200. These connections are not shown in FIG. 2.

The timer 250 may have a timer output 252 connected to the counter 220 and the control input of the integrator switch 224. The timer 250 may have an enable input connected to the mode enable input 208. The timer 250 may have a bidirectional connection 254 to the programmable register 260. The timer 250 may have a clock input (not shown) which receives a clock at the same sample frequency fs used by the sigma-delta modulator 210 to over-sample the analog input signal.

In a first mode of operation, which may be low power mode, the mode enable 208 may be set to logic high. The mode enable signal controls the multiplexer 240 to couple the output 236 of the first filter 220 to the digital output 212. The mode enable signal may enable the timer 250 which may repeatedly generate a reset pulse at a time interval determined by the value in the register 260. In other examples the interval may be hardwired into the timer in which case the register 260 may be omitted.

The operation of the sigma-delta modulator 210 in the first mode is as follows. An analog input signal received on the analog input 202 may be received at the first input of the differentiator 214. The difference between the analog signal received at the first input of the differentiator 214 and the DAC output 216 received at the second input of the differentiator 214 is integrated by the integrator 226 which also oversamples the signal at a frequency fs. The oversample frequency fs may vary depending on the desired accuracy and power consumption. Fs may for example be a frequency of 4 MHz or less in the first or low power mode of operation. The output of the integrator 226 is quantised by the quantiser 234. The output of the quantiser is a pulse density modulated (PDM) bitstream on sigma-delta modulator output 206 which is then supplied to the first filter 220. The first filter 220 may filter the signal to generate a digital signal on the digital output 212 corresponding to the analog input signal on the analog input 202.

The first filter 220 includes a counter which counts the number of pulses in the bitstream over a time interval determined by the timer 250. At the end of each time interval, timer 250 may generate a reset pulse on the timer output 252. In response to receiving each reset pulse, the first filter 220 may output the count result to the digital output 212 via the multiplexer 240 and then reset the counter value to zero. The reset pulse may also reset the sigma-delta modulator 210 by closing the integrator switch 224 which then connects the integrator output 228 to the integrator input. Typically, the integrator may include a feedback capacitor (not shown) and the switch may short out the capacitor to reset the integrator. It will be appreciated that in other examples, different methods may be used to reset the integrator.

The inventor of the present disclosure has appreciated that a relatively simple circuit which in this example is a counter may be used to implement the required filtering and down-sampling function. In this way the PDM bit stream may be converted into a digital value corresponding to the input analog signal.

In a second mode of operation, which may be high power mode, the mode enable 208 may be set to logic low. The mode enable signal controls the multiplexer 240 to couple the output 238 of the second filter 230 to the digital output 212. The mode enable signal may disable the timer 250.

The sigma-delta modulator 210 may be continuously enabled by applying an enable signal to the ADC enable input 204 such that the sigma-delta modulator 210 is continuously active. The operation of the sigma delta modulator 210 is the same as the first mode with a difference being that it is always operational and so the integrator switch 224 is always open. The oversample frequency fs may also be different and may be a higher frequency for example 12 MHz. In this second mode of operation, the second filter 230 may be implemented as a conventional decimator filter which may have improved accuracy than the first filter 220 but may be more complex and require more power to operate. The second mode of operation typically has a higher power consumption than the first mode and may operate at higher resolution and have an improved signal to noise ratio. In the second mode, the sigma-delta modulator 210 is continuously active, and so the sigma delta ADC 200 may have a higher bandwidth in the second operation mode than in the first operation mode.

The sigma delta modulator 210 as illustrated is a first order sigma-delta modulator. In other examples, second-order or higher order sigma delta modulators may be implemented with switches used to reset the integrators during the low power mode of operation. In some examples, the number of bits of the quantizer and the sample frequency fs may be selectable.

Figure 3:
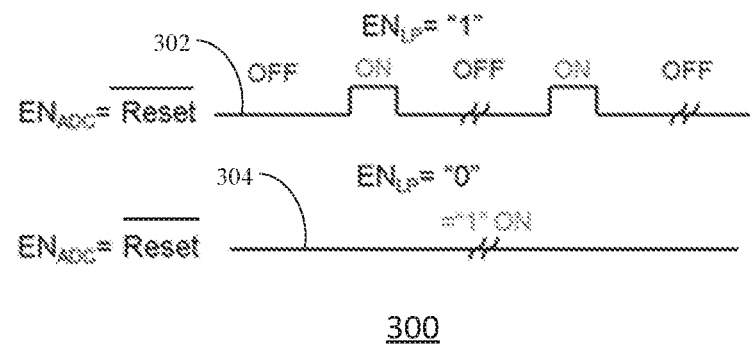
FIG. 3 Shows an example control waveform of the sigma-delta analog to digital converter of FIG. 2.

FIG. 3 illustrates an example of the signal timing 300 for sigma delta ADC 200 of the $EN_{ADC}$ signal applied at the enable input 204 and the reset signal generated by the timer 250 for each of the modes. Waveform 302 shows the first or low power mode where $EN_{LP}$ is a logic 1. The sigma-delta ADC 200 is operating in a burst or incremental mode and is enabled when $EN_{ADC}$ is logic 1 and disabled when $EN_{ADC}$ is logic 0. The reset signal generated by the timer is the inverse of the $EN_{ADC}$ signal. Waveform 304 shows the second or normal mode where $EN_{LP}$ is a logic 0. In this case the sigma-delta ADC 200 is always enabled and so the reset signal is never asserted so the reset signal may be the inverse of the $EN_{ADC}$ signal in the second mode.

An example of the relative performance in terms of power and accuracy in the two modes for different Nyquist sampling frequencies in Kilohertz is shown in table 1. The Nyquist sampling frequencies relate to the frequency of the digital output word on the digital output 212. As can be seen from this example, the power is reduced by a factor of 34 when the bandwidth is only reduced by factor of 12. In low power mode, the Nyquist frequency may correspond to the frequency of the "ON" period shown in waveform 302. In high power mode, the Nyquist frequency may be determined by the complexity of the decimation filter 302.

TABLE 1

| Sigma-delta ADC mode | $F_{nyq}$ (KHz) | Signal-to-Noise Ratio (dB) | Power consumption (µW) |
|---|---|---|---|
| High performance ADC | 48 | 100 | 340 |
| Low power burst mode | 4 | 80 | 10 |

By having a different filter for the first low power mode than the second higher power mode, a single analog front end (AFE) including the sigma-delta modulator may be used to implement a sigma-delta ADC which is configurable either in a low-power or high-power mode. The sigma-delta ADC 200 may require a smaller area compared to known solutions while still achieving required performance in both low power and normal operation modes.

Figure 4:
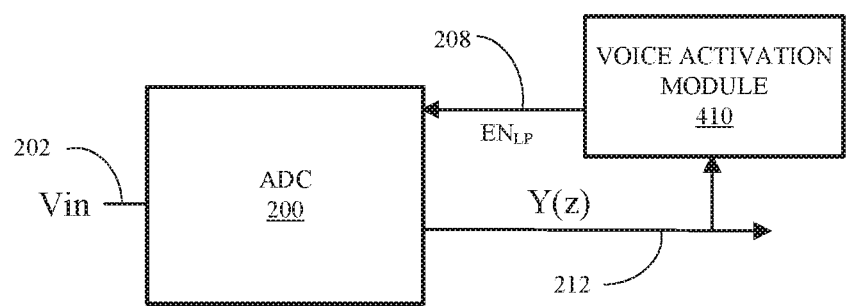
FIG. 4 illustrates a voice activity detector according to an embodiment.

FIG. 4 shows a voice activity detector 400 according to an embodiment. Voice activity detector 400 includes a voice activation module 410 and sigma delta ADC 200. In other examples sigma-delta ADC 100 may be used. The voice activation module 410 may have an input connected to the digital output 212 of the sigma-delta ADC 200. The voice activation module 410 may have a mode control output connected to the mode enable input 208 of the sigma-delta ADC 200. In operation on initial power up, the voice activity detector 400 is in a low power operation mode and the voice activation module 410 may generate a mode control signal to operate the ADC 200 either in a first low power burst mode or a second higher bandwidth mode.

In the first low power mode, the voice activity detector is "always-on" and operates in a low power mode. The inventor of the present disclosure has appreciated that in this first mode, the accuracy of the analog to digital conversion may be lower since for example only the detection of the presence or absence of speech may be required without detailed analysis of the signal content. If the voice activation module 410 detects a candidate speech signal, then it may change the operation mode of the sigma delta ADC 200 to the second mode which is a high-accuracy mode of operation. In this mode of operation, the sigma-delta ADC 200 may convert the analog signal to a digital signal with sufficient accuracy for example to allow a speech processor (not shown) to perform for example speech recognition of a word or phrase. Alternatively or in addition the speech processor may apply speech enhancement algorithms or perform other speech processing on the digital signal. The sigma-delta ADC 200 is configurable to switch between the two modes and so may support both the initial detection of the presence of an audio signal including candidate speech or some other sound in the first mode and accurate ADC conversion of audio or speech for processing by a speech or audio processor in the second mode. When in the second mode, if the received audio is determined not to contain speech, the voice activation module 208 may change the mode back to low power operation mode.

The voice activity detector 400 shows one example of a system including embodiments of the sigma-delta ADC disclosed. Embodiments of the sigma-delta ADC may be included by way of non-limiting example in audio systems, power management integrated circuits, USB devices, smart amplifiers, digital and analog microphones, instrumentation, and IoT sensors.

A sigma-delta analog-to-digital converter (ADC) is disclosed. The sigma delta ADC has an analog input and a digital output. A sigma-delta modulator input is coupled to the analog input and a sigma-delta modulator output. A first filter having a first filter input is coupled to the sigma-delta modulator output and a first filter output. A second filter having a second filter input is coupled to the sigma-delta modulator output and a second filter output. The sigma-delta ADC operates in a first and second mode. In a first mode, the first filter output is coupled to the digital output. In a second mode, the second filter output is coupled to the digital output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

TABLE OF REFERENCE SIGNS

| | |
|---|---|
| 100 | sigma-delta analog to digital converter |
| 102 | analog input |
| 104 | ADC enable input |
| 106 | sigma-delta modulator output |
| 108 | mode enable input |
| 110 | sigma-delta modulator |
| 112 | digital output |
| 120 | first filter |
| 130 | second filter |
| 200 | sigma-delta analog to digital converter |
| 202 | analog input |
| 204 | ADC enable input |
| 206 | sigma-delta modulator output |
| 208 | a mode enable input |
| 210 | sigma-delta modulator |
| 212 | digital output |
| 214 | differentiator |
| 216 | DAC output |
| 218 | digital to analog converter |
| 220 | first filter |
| 222 | Differentiator output |
| 224 | integrator switch |
| 226 | integrator |
| 228 | integrator output |
| 230 | second filter |
| 232 | ground |
| 234 | quantizer |
| 236 | first multiplexer input |
| 238 | second multiplexer input |
| 240 | multiplexer |
| 242 | first switch |
| 244 | inverter |
| 246 | second switch |
| 250 | timer |
| 252 | timer output |
| 254 | bidirectional connection |
| 260 | programmable register |
| 300 | Signal timing |
| 302 | Enable waveform for first mode |
| 304 | Enable waveform for second mode |
| 400 | Voice activity detector |
| 410 | Voice activation module |

The invention claimed is:

1. A sigma-delta analog-to-digital converter, ADC, comprising:
an analog input;
a digital output;

a sigma-delta modulator having a sigma-delta modulator input and a sigma-delta modulator output,
wherein the sigma-delta modulator input is coupled to the analog input;
a first filter having a first filter input and a first filter output,
wherein the first filter input is coupled to the sigma-delta modulator output;
a second filter having a second filter input and a second filter output,
wherein the second filter input is coupled to the sigma-delta modulator output;
wherein the ADC is configured to operate in a first mode and a second mode,
wherein in the first mode the first filter output is coupled to the digital output and
wherein in the second mode the second filter output is coupled to the digital output.

2. The sigma-delta ADC of claim 1 wherein the second filter has a higher accuracy than the first filter.

3. The sigma-delta ADC of claim 1, wherein the power consumption of the ADC is higher in the second mode than the first mode.

4. The sigma-delta ADC of claim 1, wherein in the first mode, the ADC is configured to operate in a burst mode.

5. The sigma-delta ADC of claim 1 wherein in the second mode, the ADC is configured to be continuously enabled.

6. The sigma-delta ADC of claim 1 wherein the first filter and second filter are configured as decimators.

7. The sigma-delta ADC of claim 1 wherein the first filter comprises a counter and
wherein in the first mode, the counter is configured to count the number of bits received within a predetermined time period and to output a value of the number of bits received to the first filter output.

8. The sigma-delta ADC of claim 7 further comprising a timer coupled to the sigma-delta modulator and the counter,
wherein the timer is configured in the first mode to generate a reset signal after a predetermined time; and
wherein the counter is configured in response to receiving the reset signal to output the current count value to the digital output and to reset the count to zero and the sigma-delta modulator is configured to reset in response to receiving the reset signal.

9. The sigma-delta ADC of claim 8 further comprising a register coupled to the timer,
wherein in the first mode, the timer is further configured to generate a reset signal after a time interval determined from a value in the register.

10. The sigma-delta ADC of claim 7 further comprising a multiplexer having
a first multiplexer input coupled to the first filter output,
a second multiplexer input coupled to the second filter output,
a control input coupled to a mode control input; and
a multiplexer output coupled to the digital output.

11. The sigma-delta ADC of claim 10 wherein the mode control input is coupled to the timer.

12. The sigma-delta ADC of claim 1 wherein the sigma-delta modulator comprises an integrator configured in the first mode to be reset after a predetermined time interval.

13. The sigma-delta ADC of claim 12
wherein the sigma-delta modulator comprises
a series arrangement of a summing module, the integrator and a comparator between the sigma-delta modulator input and the sigma-delta modulator output; and
a digital to analog converter, DAC, having an input coupled to the sigma-delta modulator output and an output coupled to an inverting input of the summing module,
and
wherein the sigma-delta modulator input is coupled to a non-inverting input of the summing module.

14. A voice activity detector comprising the sigma-delta ADC of claim 1,
wherein the sigma-delta ADC is configured to change from the first mode to the second mode in response to the detection of an audio signal.

15. The voice activity detector of claim 14 comprising
a voice activation module having an input coupled to the digital output and an output configured to generate a mode control signal
wherein the sigma-delta ADC is configured to receive the mode control signal and to set the operation mode to either the first mode or the second mode dependent on the mode control signal.

16. The sigma-delta ADC of claim 1
wherein the first filter and second filter are configured as decimators and
wherein the first filter comprises a counter and
wherein in the first mode, the counter is configured to count the number of bits received within a predetermined time period and to output a value of the number of bits received to the output.

17. The sigma-delta ADC of claim 16
further comprising a timer coupled to the sigma-delta modulator and the counter,
wherein the timer is configured to in the first mode to generate a reset signal after a predetermined time; and
wherein the counter is configured in response to receiving the reset signal to output the current count value to the digital output and to reset the count to zero and the sigma-delta modulator is configured to reset in response to receiving the reset signal and
wherein the sigma-delta modulator further comprises an integrator configured in the first mode to be reset after a predetermined time interval.

18. The sigma-delta ADC of claim 17
wherein the integrator comprises a capacitor in the feedback path and is configured to be reset by shorting the capacitor.

19. The sigma-delta ADC of claim 18 further comprising
a timer coupled to the sigma-delta modulator and the counter,
wherein the timer is configured to in the first mode to generate a reset signal after a predetermined time; and
wherein the counter is configured in response to receiving the reset signal to output the current count value to the digital output and to reset the count to zero and the sigma-delta modulator is configured to reset in response to receiving the reset signal and
a multiplexer having a first multiplexer input coupled to the first filter output, a second multiplexer input coupled to the second filter output, a control input coupled to a mode control input; and a multiplexer output coupled to the digital output.

20. The sigma-delta ADC of claim 19
wherein in the first mode, the ADC is configured to operate in a burst mode and wherein in the second mode, the ADC is configured to be continuously enabled.

21. A sigma-delta analog-to-digital converter, ADC, comprising:
an analog input;
a digital output;
a sigma-delta modulator having a sigma-delta modulator input and a sigma-delta modulator output;
wherein the sigma-delta modulator input is coupled to the analog input;
a first filter having a first filter input and a first filter output;
wherein the first filter input is coupled to the sigma-delta modulator output;
a second filter having a second filter input and a second filter output;
wherein the second filter input is coupled to the sigma-delta modulator output;
wherein the ADC is configured to operate in a first mode and a second mode;
wherein in the first mode the first filter output is coupled to the digital output;
wherein in the second mode the second filter output is coupled to the digital output;
wherein the first filter comprises a counter; and
wherein in the first mode, the counter is configured to count the number of bits received within a predetermined time period and to output a value of the number of bits received to the first filter output.

22. A sigma-delta analog-to-digital converter, ADC, comprising:
an analog input;
a digital output;
a sigma-delta modulator having a sigma-delta modulator input and a sigma-delta modulator output;
wherein the sigma-delta modulator input is coupled to the analog input;
a first filter having a first filter input and a first filter output;
wherein the first filter input is coupled to the sigma-delta modulator output;
a second filter having a second filter input and a second filter output;
wherein the second filter input is coupled to the sigma-delta modulator output;
wherein the ADC is configured to operate in a first mode and a second mode;
wherein in the first mode the first filter output is coupled to the digital output;
wherein in the second mode the second filter output is coupled to the digital output; and
wherein the sigma-delta modulator comprises an integrator configured in the first mode to be reset after a predetermined time interval.

\* \* \* \* \*